United States Patent
Lo et al.

(10) Patent No.: US 6,358,859 B1
(45) Date of Patent: Mar. 19, 2002

(54) HBR SILICON ETCHING PROCESS

(75) Inventors: Wen-Hao Lo, Hsin-Chu; Wen-Chyi Wang, Chu-Nan, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/578,410

(22) Filed: May 26, 2000

(51) Int. Cl.[7] ............................................. H01L 21/302
(52) U.S. Cl. ..................... 438/712; 438/714; 438/719
(58) Field of Search ................................ 438/706, 707, 438/708, 709, 710, 712, 714, 719

(56) References Cited

U.S. PATENT DOCUMENTS

| | | | |
|---|---|---|---|
| 4,490,209 A | * 12/1984 | Hartman | 156/643 |
| 5,007,982 A | * 4/1991 | Tsou | 156/643 |
| 5,605,603 A | 2/1997 | Grimard et al. | 156/662.1 |
| 5,854,137 A | * 12/1998 | Kuo | 438/714 |
| 5,874,362 A | * 2/1999 | Wong et al. | 438/719 |
| 6,242,350 B1 | * 6/2001 | Tao et al. | 438/690 |

* cited by examiner

Primary Examiner—Benjamin L. Utech
Assistant Examiner—Duy-Vu Deo
(74) Attorney, Agent, or Firm—George O. Saile; Stephen B. Ackerman

(57) ABSTRACT

A method for removing chemisorbed halogens from the surface of a silicon wafer after a plasm etching process is described. The removal takes place before the wafer is unloaded from the etching chamber in order to avoid exposure to atmospheric moisture. Exposure to moisture would cause the discharge of the chemisorbed halogen into the ambient causing corrosion of metal surfaces, particulate formation which reduces product yield, and unsafe halogen levels near the etching tool. The method is particularly useful during silicon etching with HBr where considerable amounts of bromine are chemisorbed onto wafer surfaces. After the etching process is complete, and without breaking vacuum, a carrier gas containing water vapor is flowed over the wafer for a brief time period. The chemisorbed bromine reacts with the water vapor and is converted to HBr which is then purged from the chamber. The embodiments of the invention are described for a single wafer etching tool wherein wafers are loaded and unloaded through a load lock. The water treatment which removes the adsorbed halogens is preferably not conducted in main etching chamber but in a separate chamber. Corrosion of metal surfaces within the load lock and accompanying particle formation is prevented when the chemisorbed bromine is removed before the etched wafer enters the load lock.

22 Claims, 4 Drawing Sheets

HBR SILICON ETCHING PROCESS

BACKGROUND OF THE INVENTION

(1) Field of the Invention

The invention relates to processes for the manufacture of semiconductor devices and more particularly to processes related to the formation of STI (shallow trench isolation).

(2) Background to the Invention and Description of Related Art

The formation of integrated circuit devices on silicon substrates requires that a means be provided to electrically isolate the various circuit components from each other. To this end regions of field insulation, typically of silicon oxide, are formed adjacent to the circuit components.

The well known method of local oxidation of silicon (LOCOS) to form field oxide isolation around semiconductive devices built into the surface of silicon wafers has been practiced for over twenty-five years and has served well to provide field isolation for many applications. Over the years many problems with LOCOS have surfaced which have been addressed in a great variety of ways. Most notable are the problems which deal with the growth of oxide under the hardmask used to define the oxide regions and the resultant uneven surface topology over the field oxide. The oxide penetration under the mask is commonly referred to as birds-beak. These problems still persist and become aggravated as the technology tends towards smaller, shallower devices at high densities.

A promising replacement for LOCOS field oxide isolation has been found in trench isolation. Although deep trench isolation(DTI) has been used nearly as long as LOCOS for bipolar transistor isolation, it has not been widely practiced in the manufacture of CMOS (complimentary metal oxide silicon) integrated circuits. More recently, however, as device densities increase and isolation widths become smaller, shallow trench isolation(STI) is gaining favor over LOCOS in CMOS technology. The Trenches are formed in the silicon around the semiconductor devices by reactive ion etching. They are then lined with a thin thermal silicon oxide and filled with silicon oxide or with another material such as polysilicon. Although a number of halogen chemistries have been reported for etching the silicon trenches, one of the most successful and widely preferred contains HBr as the primary etchant.

Wong, et.al., U.S. Pat. No. 5,874,362 reports the etching of high aspect ratio (depth/width) silicon and polysilicon trenches with the brominate gases HBr and $CF_2Br_2$ and with the iodinate gas HI. Grimard, et.al., U.S. Pat. No. 5,605,603 reports comparable results of 8–12 micron deep silicon trenches with desirable profiles and low mask erosion using an etchant containing HBr and $NF_3$. The use of this etchant combination results in improved high aspect ratio trench profiles.

A problem with reactive etching with HBr is that bromine can become strongly chemisorbed onto surfaces of the wafer, presumably in the form of Si—O—Br segments which occurs as a by-product of trench etching. Also bromine is chemisorbed onto the surface of a silicon oxide hardmask, which is typically used for etching STI trenches. In addition bromine adsorbs directly onto the freshly exposed silicon surfaces. On a 200 or 300 mm diameter wafer, the chemisorbed bromine is spread over a considerable amount of surface area. The bromine thus adsorbed cannot be pumped or flushed out in the conventional manner after the etching process is completed. As a result, when the wafer is subsequently exposed to atmospheric moisture the bromine is liberated as HBr according to the reaction:

$$H_2O + Si—O—Br \rightarrow HBr + SiO_2$$

Most present day etching tools are of the single wafer variety which employ a load lock through which wafers are loaded and unloaded to the main etching chamber. It is in the load lock chamber, that the wafer becomes exposed to moisture. The liberated HBr causes corrosion of metal surfaces in the load lock chamber which is accompanied by the formation of particulates. These particulates subsequently find their way onto wafer surfaces causing yield loss. In addition the reaction causes the formation of $SiO_2$ particulates which also contribute to yield loss. While the main etching chamber is relatively well protected from atmospheric moisture, the residual HBr acts primarily within the load lock chamber.

Aside from wafer yield losses, the liberation of HBr from wafer surfaces also becomes a safety hazard. Whereas a level of less than 3 ppm of HBr may be considered to be a safe level of HBr, measurements made by the present inventors have shown HBr levels of about 9 ppm in the neighborhood of the etching tool when operated in the conventional manner.

It is therefore desirable to have a procedure for removing all residual bromine, including that which is chemisorbed on the wafer before the wafer is exposed to atmospheric moisture. In addition, in a high throughput manufacturing operation, it is sought to effect such removal with dispatch without requiring extensive pumping or baking to dislodge the chemisorbed bromine. The process disclosed by this invention is such a method.

HBr is used pattern polysilicon gate electrodes in the manufacture of self-aligned polysilicon gate MOSFETs (metal oxide silicon field effect transistors). These devices are the mainstay of today's integrated circuit industry. The polysilicon gate electrodes are patterned in a deposited conductive layer stack formed over a thin silicon oxide which forms the gate dielectric of the MOSFET. The conductive layer stack typically comprises a bottom undoped polysilicon layer over which a doped polysilicon layer or a layer of a transition metal silicide is deposited to improve the conductivity. The latter configuration is referred to a polycide gate structure. An insulative cap layer is deposited over the conductive layers and the stack is then patterned with a photoresist mask.

The silicon oxide gate layer is extremely thin, typically less than 100 Angstroms and often as thin as 20 Angstroms. The gate electrode must be patterned with an anisotropic plasma etch such as RIE. The etching must stop on the thin silicon oxide layer without penetrating it. Finally, an overetch period must be employed to assure that all vestiges of polysilicon are removed in order to avoid subsequent shorts. In order to meet these stringent requirements a polysilicon etchant which has a very high polysilicon-to-silicon oxide selectivity must be used. Etchants containing HBr have are most widely preferred to meet these criteria. However, upon completion of the silicon etching, bromine remains strongly chemisorbed on the exposed silicon oxide surfaces and causes the same corrosion problems, yield losses, and safety concerns which accompany the silicon trench etching processes described above.

SUMMARY OF THE INVENTION

It is an object of this invention to provide a method for removing residual HBr from a plasma etching tool after a silicon etching operation without requiring extensive pumping or baking.

It is another object of this invention to provide a method for reducing the cycle time of a silicon etching tool wherein HBr or other halogen containing agent is employed which can cause corrosion of metal surfaces of the tool which may become exposed to moisture during loading and unloading.

It is yet another object of this invention to thoroughly remove bromine chemisorbed on a wafer after processing with HBr before said wafer is exposed to atmospheric moisture.

It is another object of this invention to provide a method for improving process yield of a plasma etching tool wherein wafers are loaded and unloaded through a load lock.

These objects are accomplished by subjecting the wafer to gas flow containing $H_2O$ after the trench etching process is completed. In the process, residual HBr and chemisorbed bromine or other halogen containing species from the silicon etching, are entirely removed from the wafer prior before the wafer is transferred into the load lock. The halogen removal is accomplished in an intermediate transfer chamber located within the etching tool. After etching, the wafer is moved out of the main etching chamber and into the intermediate transfer without breaking vacuum. A flow of water vapor in a carrier gas is passed over the wafer in the transfer. The water vapor converts chemisorbed bromine into gaseous HBr which is then pumped directly out of the transfer chamber. After the bromine is removed and purged from the transfer chamber, the wafer is moved into the load lock, without breaking vacuum, and unloaded from the machine in the conventional manner.

DESCRIPTION OF THE PREFERRED EMBODIMENTS

Figure 1A:
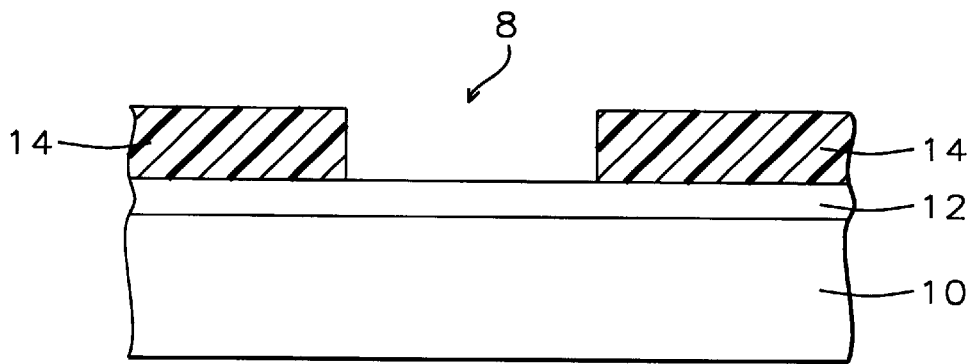
FIG. 1A through FIG. 1D are cross sections of a portion of a silicon wafer showing process steps used in to etch a trench in the silicon according to a first embodiment of the present invention.

In a first embodiment of the current invention, a monocrystalline <100> oriented p-type silicon wafer is provided. Referring to FIG. 1A, silicon oxide layer 12, between about 0.1 and 0.5 microns thick, is formed on the wafer 10 preferably by thermal oxidation. A layer of photoresist 14 is patterned by conventional, preferentially deep ultraviolet (DUV), photolithography to define an opening 8. wherein an STI trench is to be formed. An oxide hardmask is first formed by etching the silicon oxide layer 12 in a plasma or RIE etching tool with an etchant gas mixture which has a high selectivity of silicon oxide to photoresist. Such gas mixtures typically contain one or more fluorocarbons such as $CF_4$, $CH_2F_2$, and the like. Etchant gas mixtures and parameters for patterning $SiO_2$ with a photoresist mask are well known in the art.

Figure 1B:
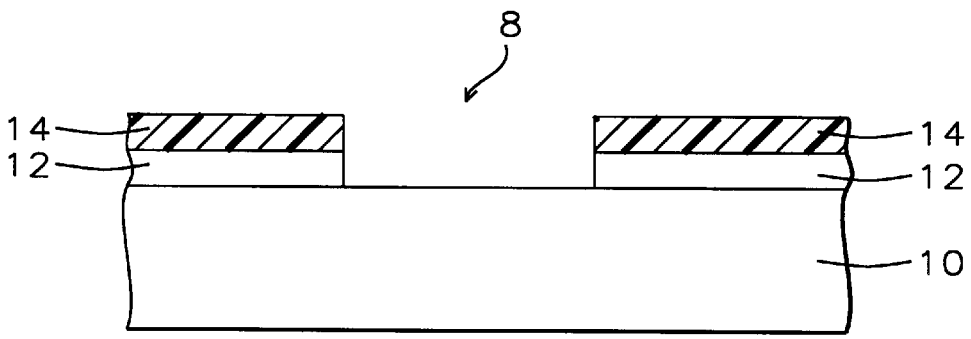

FIG. 1B shows the cross section of the wafer 10 after the opening 8 has been patterned in the silicon oxide layer 12. The residual photoresist 14 which remains after the mask patterning is allowed to remain whereupon it may be completely consumed during the subsequent silicon etching step. Alternately, the photoresist layer 14 may be removed immediately after the oxide hardmask 12 is patterned by ashing in a plasma containing oxygen or by a liquid stripper. The wafer 10 is then loaded from a cassette carrier into a single wafer reactive ion etching tool wherein a silicon trench will be etched.

Figure 2:
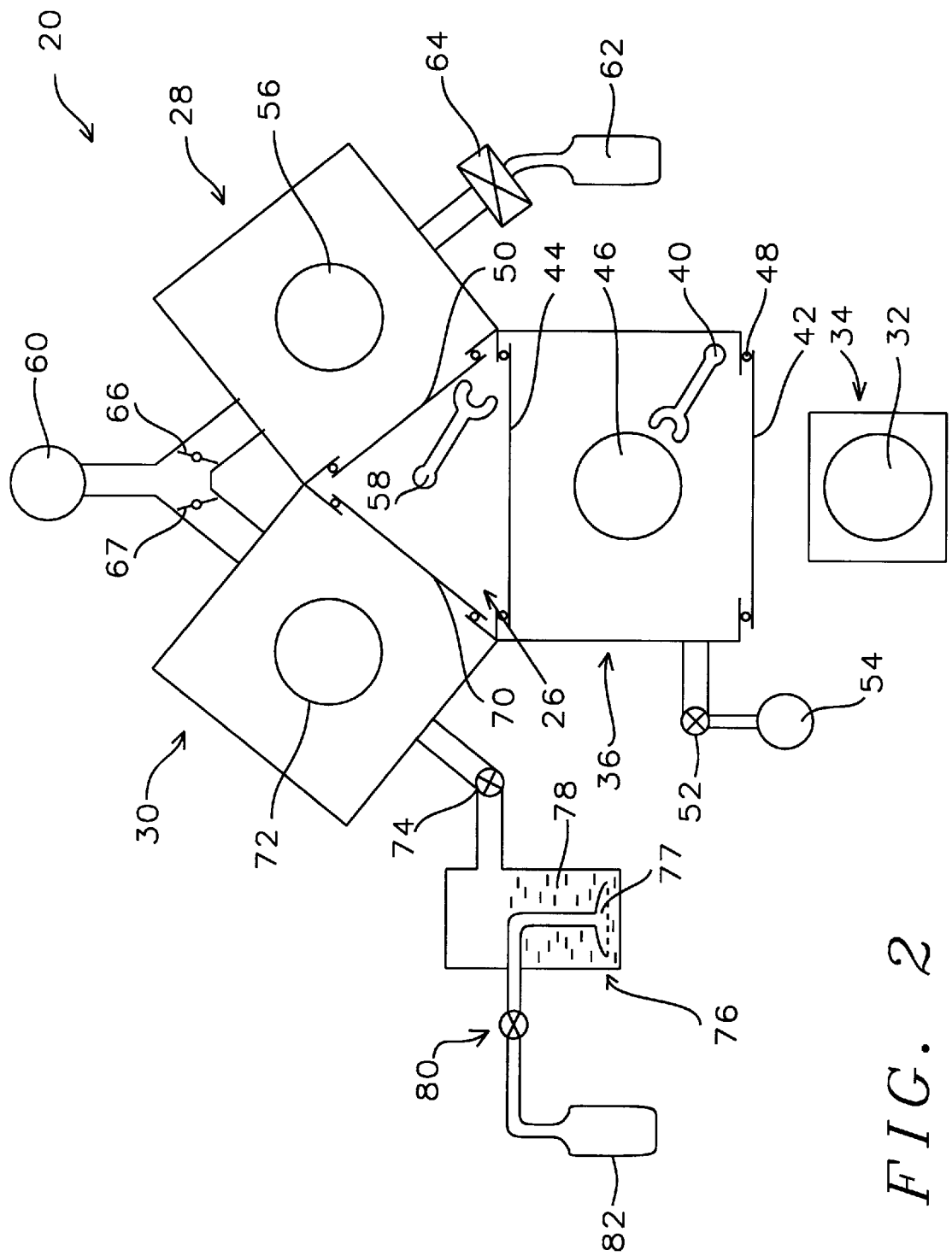
FIG. 2 shows a top sectional view of the essential elements of a typical single wafer plasma processing tool wherein wafers are loaded and unloaded, one at a time, from a cassette into a load lock and then into the internal operational chambers of the tool.

Referring to FIG. 2, there is shown a top sectional view of the essential elements of a single wafer plasma processing tool 20 wherein wafers 32 are loaded and unloaded, one at a time, from a cassette 34 into a load lock 36 and then into a central region 26 of the tool from which they are moved into and out of the various operational chambers of the tool which include a main etching chamber 28, and a transfer chamber 30. In operation the main etching chamber 28 is maintained under vacuum at all times except when etching takes place. Similarly the transfer chamber 30 and the central region 26 are not exposed to atmosphere while the tool is in use. In other words, when on-line, the internal chambers of the plasma processing tool 20 are never exposed to atmosphere. The wafer 10 which has been previously patterned with photoresist according to FIG. 1A and loaded into the cassette 34. Wafer 10 is selected from a plurality of wafers 32 in the cassette 34 by a robot arm 40 with the loading gate 42 open. The loading gate 42 is operated by a solenoid mechanism (not shown). The robot arm 40 places the selected wafer onto the pedestal 46 and the loading gate 42 is closed against a seal 48.

Valve 52 is opened and the load lock 36 is evacuated by the vacuum pump 54. A second gate valve 50, remains closed and the main etching chamber 28, the transfer chamber 30 and the central region 26 are kept under vacuum by the pumping station 60. With the load lock 36 evacuated, gates 44 and 50 are opened and the wafer 10 is transferred from the load lock pedestal 46 onto the pedestal 56 in the main etch chamber 28 by the robot arm 58. The gates 44 and 50 are again closed and plasma etching of a trench in the silicon wafer 10 is begun.

With wafer 10 on the pedestal 56 of the main chamber 38, gate valve 50 is closed and the chamber 28 is further evacuated to a background pressure by the pumping station 60. The pedestal 56 comprises an rf electrode, typically a cathode, which is insulated from the chamber 28 and driven by an rf power supply (not shown) and an impedance matching network (not shown). A parallel counter-electrode is located over the pedestal 56 and is either grounded or electrically biased. The structural and electrical configuration of the components used to establish an etching plasma in a plasma etching tool are well known and vary according to design and function of different commercially available plasma etching applications and need not be described here. The etching chamber 28 may also be configured for HDP (high density plasma) etching.

When the etching chamber 28 has been evacuated, an etchant gas mixture is admitted into the main chamber from a supply 62 and it's flow is regulated by a mass flow controller 64. Although only a single supply and controller are shown in the figure, it will be understood that a multiple gases may be controllably flowed during an etching process, each having it's own supply 62 and flow controller 64.

Figure 1C:
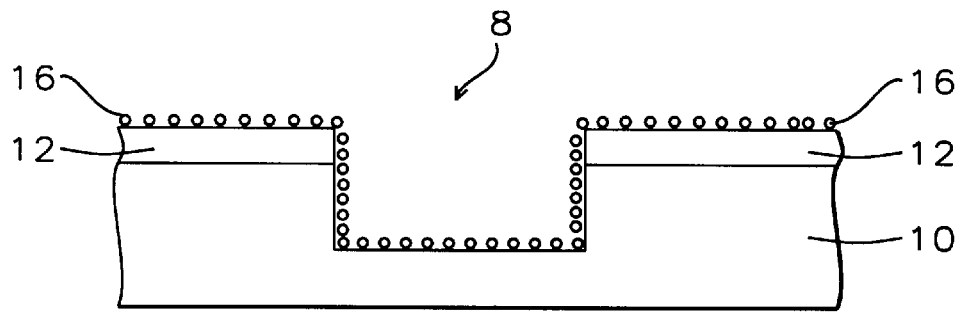

Referring to FIG. 1C, an etchant gas mixture containing HBr is selected to anisotropically etch a silicon trench in the opening 8. In the present embodiment, HBr at a flow rate of between about 3,000 and 6,000 SCCM (standard cubic centimeters per minute) in a neutral carrier gas of nitrogen at between about 300 and 400 SCCM. is introduced into the chamber 28. The chamber pressure is maintained at between about 2 and 4 Torr by throttling the pumping speed with a throttle valve 66 (FIG. 2).

A plasma is struck in the chamber 28 and a trench is etched into silicon surface of the wafer 10 in the opening 8 by RIE (reactive ion etching). During the trench etching most if not all of the photoresist mask 14 is consumed, if the mask had been left in place after the hardmask patterning. When DUV photolithography is employed, the photoresist mask is necessarily made as thin as possible in order to achieve the pattern resolution sought by sub-quarter micron technology. The thickness of the photoresist is therefore applied only thick enough to pattern the $SiO_2$ hardmask. Any residual photoresist remaining after hardmask patterning is dispatched in the early stages of the silicon etching. As a result, the surface of the $SiO_2$ hardmask is exposed early in the silicon etching process.

Bromine ions from the HBr plasma become attached onto the hardmask surface in the form of Si—O—Br bonds and a strongly chemisorbed layer 16 of bromine ions forms on the exposed $SiO_2$ surfaces. Bromine also adsorbs strongly onto exposed silicon surfaces such as those within the freshly etched trench. Although other oxide surfaces may be found in the etching chamber, for example, glass view ports, these do not come in close contact with the HBr etching plasma and consequently are not subjected to significant bromine adsorption. The adsorbed bromine layer 16 is relatively stable and can not be pumped out or flushed out of the system with a purging gas.

After the Silicon trench etching has been completed, the etchant gases are purged from the chamber 28 with a flow of a neutral gas, preferably nitrogen at between about 300 and 400 SCCM. Alternately argon or helium may be used as the neutral gas. The chamber 28 is then evacuated and the wafer is transferred, under vacuum, from the main etching chamber 28 onto the pedestal 72 in the evacuated transfer chamber 30 by the robot arm 58 though the opened gates 50 and 70.

Figure 1D:
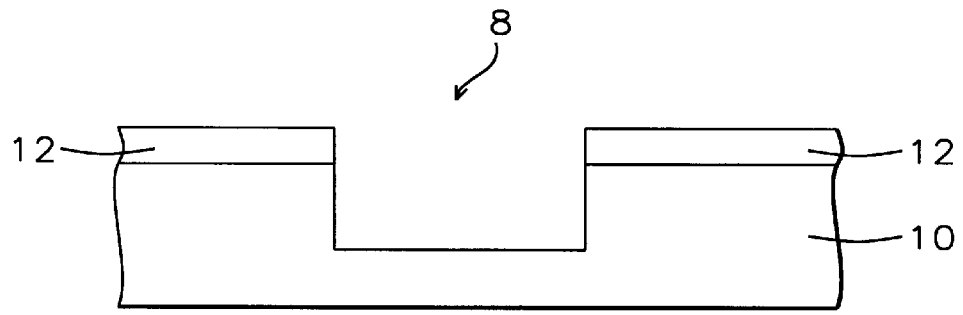

The transfer chamber 30 is provided with a solenoid valved input port 74 which is attached to the output of a heated bubbler 76. The bubbler 76 is filled with water and fitted with a dispersion head 77 and a nitrogen carrier gas source 82. With the gate valve 70 closed and the pumping throttle 67 open, water vapor is introduced into the transfer chamber 30 by passing a flow of nitrogen through the bubbler 76 and thence flowing the resultant water saturated nitrogen into the chamber 30. The gas flow is throttled by the valve 67 to maintain a chamber pressure of between about 2 and 4 Torr for between about 30 and 60 seconds after which the nitrogen flow is stopped, the valve 74 closed, and the chamber 30 is evacuated. During the period of water vapor flow, the chemisorbed bromine layer 16 is discharged from the oxide and silicon surfaces and purged from the chamber. The wafer surfaces are now free of bromine residues. FIG. 1D shows the wafer cross section after the bromine layer 16 has been discharged and removed.

After the treatment, the wafer 10 is transferred back onto the pedestal 46 in the evacuated load lock by robot arm 58. Then, after closing the gate valve 44, the pressure in the lock 36 is brought to atmosphere and the wafer returned to the cassette 34 by the robot arm 40. No bromine is transferred into the load lock and corrosion and particulate formation in the lock does not occur when the wafer is again exposed to atmospheric moisture.

Figure 3A:
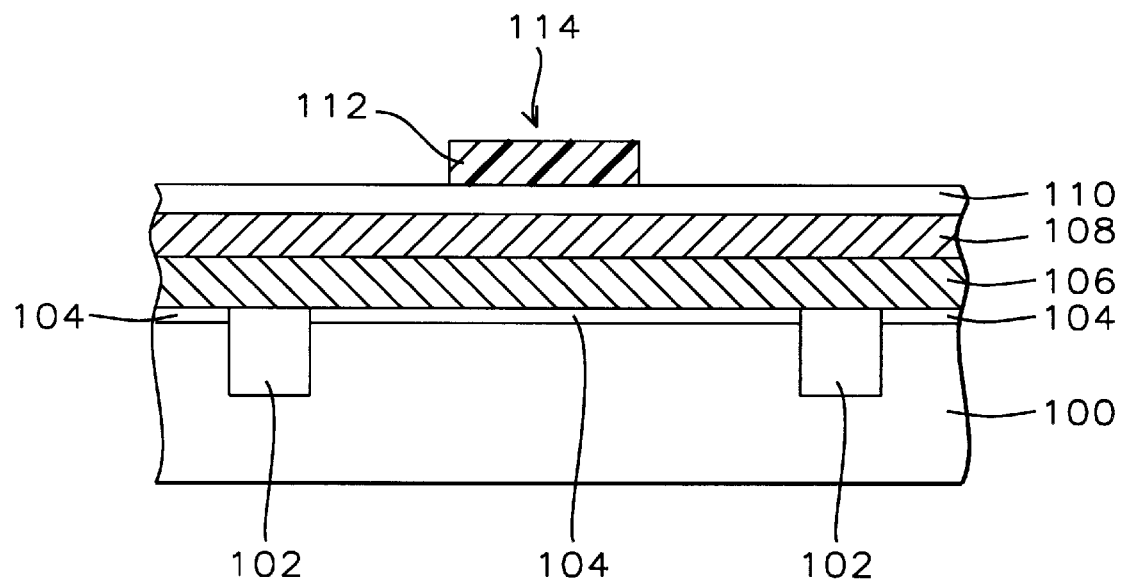
FIG. 3A through FIG. 3D are cross sections of a portion of a silicon wafer showing process steps used in to plasma pattern a polycide gate electrode on the silicon according to a second embodiment of the present invention.

In a second embodiment of the invention, HBr is used pattern a polysilicon gate electrode in the manufacture of a self-aligned polysilicon gate MOSFET. Referring to FIG. 3A, a 200 mm. diameter monocrystalline silicon wafer 100 is provided. Field oxide isolation regions(FOX) 102 are formed on the wafer 100 using the well known STI method. A thin gate oxide 104 is grown by thermal oxidation of the silicon wafer 100 in dry oxygen. The thickness of the gate oxide layer 104 in this embodiment is between about 30 and 125 Å although thicker gate oxides may be used as well. A self aligned polycide gate MOSFET is to be formed having a gate electrode consisting of a first layer of polysilicon and a second layer of tungsten silicide($WSi_x$).

A layer of undoped polysilicon 106 is deposited over the wafer by CVD (chemical vapor deposition) methods well known by those practicing the art, for example by the pyrolysis of silane in hydrogen between 550° C.–650° C. A layer of tungsten silicide 108 is then deposited over the polysilicon layer 106 for example by the reaction of $WF_6$ and silane between about 350° C. and 450° C. The depositions may be done sequentially in the same furnace.

Alternatively the polysilicon layer 106 may be formed compositely having the first portion undoped and the final portion doped with, for example, arsenic or phosphorous. Alternatively the layer 108 may also be formed of another metal silicide, for example titanium silicide or tantalum silicide. Methods for the deposition of these various materials are well known and widely practiced.

The polysilicon layer 106 and the $WSi_x$ layer 108 form the conductive gate electrode of a self-aligned polycide gate MOSFET. A cap oxide 110 between about 500 and 1000 Å thick is deposited onto the $WSi_x$ layer 108 by CVD. Photoresist 112 is applied and patterned 114 to define a gate electrode. The cap oxide 110 is then etched to the subjacent $WSi_x$ layer 108 in a plasma or RIE etching tool with an gas mixture which has a high selectivity of silicon oxide to-photoresist. Such gas mixtures typically contain one or more fluorocarbons such as $CF_4$, $CH_2F_2$, and the like. Etchant gas mixtures and parameters for patterning $SiO_2$ with a photoresist mask are well known in the art.

Figure 3B:
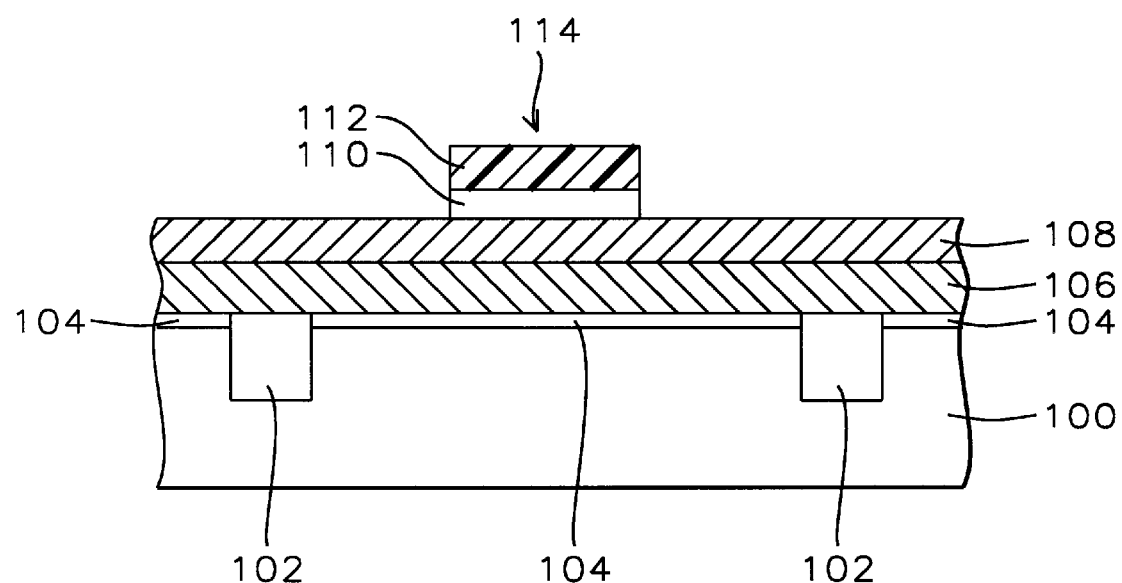

FIG. 3B shows the cross section of the wafer 110 after the silicon oxide layer 110 has been etched. Residual photoresist 112 is allowed to remain whereupon it may be completely consumed during the subsequent silicon etching step. Alternately, the photoresist layer 112 may be removed immediately after the oxide etch by ashing in a plasma containing oxygen or by a liquid stripper. The wafer 110 is then loaded from a cassette carrier into the single wafer plasma etching tool shown in FIG. 2 and described in the first embodiment wherein the tungsten silicide layer 108 and the polysilicon layer 106 will be patterned by etching with HBr to form a polysilicon gate.

The wafer 100, in cassette 34, is selected from a plurality of wafers 32 and loaded onto pedestal 46 in the load lock 36 of the plasma etcher 20, which is preferably a high density plasma(HDP) parallel plate etcher with chambers configured as shown in FIG. 2. As in the first embodiment, the load lock 36 is evacuated and the wafer 100 is transferred under vacuum onto the pedestal 56 in the main etch chamber 28 of the etching tool through opened valve ports 44 and 50 by robot arm 58. The main chamber of the etching tool is further evacuated to a background pressure.

The tungsten silicide layer 108 is etched with an etchant containing chlorine and the polysilicon layer 106 is then etched with an etchant composition consisting of $Cl_2$ at a flow rate of between about 70 and 90 SCCM and HBr at a flow rate of between about 110 and 130 SCCM in a carrier gas of helium. The flow rate of the carrier gas is adjusted to maintain a pressure of between about 8 and 12 mTorr in the reactor chamber. An rf discharge having a power of about 250 Watts TCP and about 200 Watts BIAS is struck in the HDP reactor and maintained until an endpoint is reached. The endpoint is determined by optical emission spectroscopy by observing the decline of a silicon peak at 405 nm. This occurrence signals the appearance of patches of exposed gate oxide and the onset of clearing the surface of polysilicon.

In order to minimize the loss of gate oxide 104, the etchant composition is now altered to further increase the selectivity of polysilicon over oxide at the expense of etch rate in an over etch period. To do this the $Cl_2$ flow is terminated and the HBr flow rate is increased. The over-etch removes all vestiges of exposed polysilicon and is performed as a timed etch in an etchant composition consisting of HBr at a flow rate of between about 180 and 220 SCCM in a helium carrier gas. The flow of the carrier gas is adjusted to maintain a pressure of between about 55 and 65 mTorr in the reactor chamber. An rf power of about 230 Watts TCP and about 180 Watts BIAS is applied and maintained for an over etch time period of between about 20 and 40 seconds.

Figure 3C:
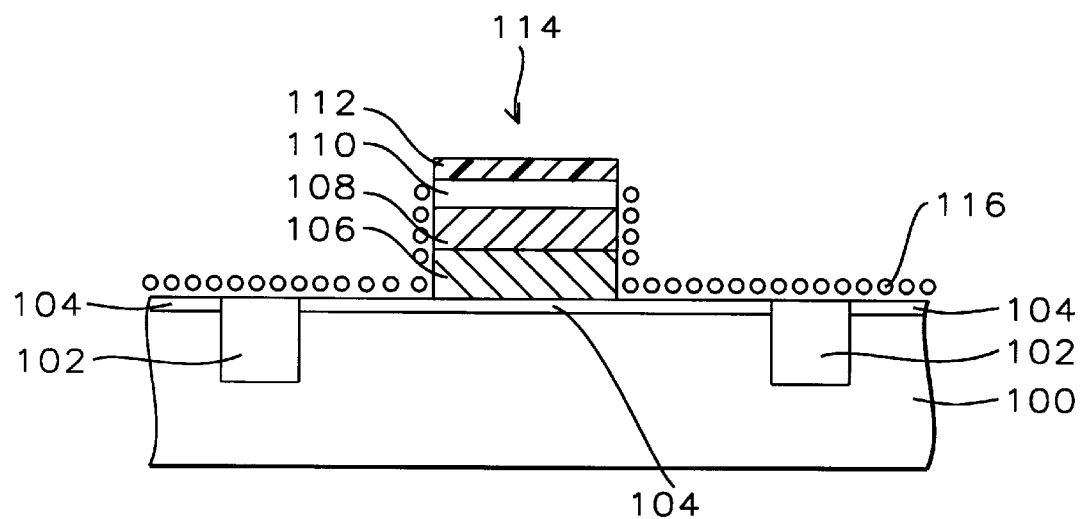

Referring now to FIG. 3C, after the gate stack 114 has been etched, residual photoresist 112 may remain over the cap oxide and bromine ions from the HBr plasma are attached as Si—O—Br bonds to form a strongly chemisorbed bromine layer 116 on the exposed $SiO_2$ surfaces. Although other oxide surfaces may be found in the etching chamber, for example, glass view ports, these do not come in close contact with the HBr etching plasma and consequently are not subjected to significant bromine adsorption. The adsorbed bromine layer 116 is relatively stable and can not be pumped out or flushed out of the system with a purging gas.

After the polysilicon gate etching has been completed, the etchant gases are purged from the chamber 28 with a flow of a neutral gas, preferably nitrogen at between about 300 and 400 SCCM. The chamber 28 is then evacuated and the wafer 100 is transferred, under vacuum, from the main etching chamber 28 onto the pedestal 72 in the evacuated transfer chamber 30 by the robot arm 58 though the opened gates 50 and 70.

Figure 3D:
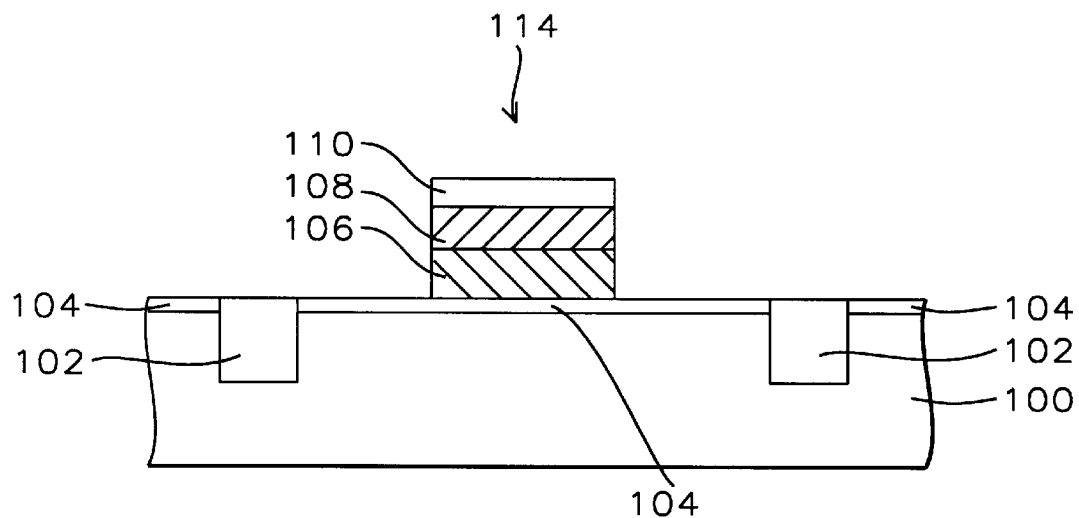

With the gate valve 70 closed and the pumping throttle 74 open, water vapor is introduced into the transfer chamber 30 by passing a flow of nitrogen through the water filled bubbler 76 and thence flowing the resultant water saturated nitrogen into the chamber 30. The gas flow is throttled by the valve 67 to maintain a chamber pressure of between about 2 and 4 Torr for between about 30 and 60 seconds after which the nitrogen flow is stopped, the valve 74 closed, and the chamber 30 is evacuated. During the period of water vapor flow, the chemisorbed bromine layer 116 is discharged from the oxide and silicon surfaces and purged from the chamber. The wafer surfaces are now free of bromine residues. FIG. 3D shows the wafer cross section with the completed gate electrode 114, after the bromine layer 116 has been discharged from the wafer by the water treatment and purged from the chamber.

After the water treatment, the wafer 100 is transferred back onto the pedestal 46 in the evacuated load lock by robot arm 58. Then, after closing the gate valve 44, the pressure in the lock 36 is brought to atmosphere and the wafer 100 is returned to the cassette 34 by the robot arm 40. No bromine is transferred into the load lock and corrosion and particulate formation in the lock does not occur when the wafer is again exposed to atmospheric moisture.

While this invention has been particularly shown and described with reference to the preferred embodiments thereof, it will be understood by those skilled in the art that various changes in form and details may be made without departing from the spirit and scope of the invention.

While HBr is considered to be the most widely used silicon etchant species in plasma etching applications where a high silicon-to-oxide selectivity is sought along with high quality anisotropic etching, the use of other halogen containing etchant gases such as HI, $Cl_2$, $CCl_4$, $BrCl_3$, and $Br_2$ may also result in halogen chemisorption on surfaces of in process silicon wafers. It should be understood that these chemisorbed halogens may also be advantageously removed by the methods taught by this invention.

What is claimed is:

1. A method for etching a trench in a silicon wafer comprising:
    (a) providing a silicon wafer;
    (b) forming a hardmask defining a trench on said wafer;
    (c) providing an etching tool having an etching chamber, a transfer chamber, and a load lock;
    (d) loading said wafer into said etching chamber;
    (e) etching said trench in said wafer with a plasma formed in a first gas flow containing a halogen species whereby a chemisorbed halogen layer forms on surface regions of said wafer;
    (f) purging said etchant gas from said etch chamber with a neutral gas;
    (g) after step (f) and without breaking vacuum, transferring said wafer from said etching chamber into evacuated said transfer chamber;
    (h) subjecting said wafer to a second flow of a carrier gas containing water for a time period whereby said chemisorbed halogen layer is discharged from said surface regions and purged from said transfer chamber;
    (i) evacuating said transfer chamber;
    (j) after step (i) and without breaking vacuum, transferring said wafer from said transfer chamber into said load lock; and
    (k) unloading said wafer from said etching tool.

2. The method of claim 1 wherein said hardmask comprises silicon oxide.

3. The method of claim 1 wherein said halogen species is HBr.

4. The method of claim 1 wherein said neutral gas is selected from the group consisting of helium, argon, and nitrogen.

5. The method of claim 1 wherein said water is introduced into said carrier gas by passing said carrier gas, first through a water bubbler, heated to between about 20 and 25° C. and thence into said transfer chamber at a flow rate sufficient to maintain a chamber pressure of between 2 and 4 Torr.

6. The method of claim 5 wherein said carrier gas is nitrogen.

7. The method of claim 1 wherein said time period is between about 30 and 60 seconds.

8. A method for patterning a polysilicon gate electrode over a gate oxide comprising:
    (a) providing a silicon wafer having a gate oxide;
    (b) depositing a polysilicon gate stack layer on said gate oxide;
    (c) forming a mask on said polysilicon gate stack layer to define a gate electrode;
    (d) providing an etching tool having an etching chamber, a transfer chamber, and a load lock;

(e) loading said wafer into said etching chamber;

(f) etching said polysilicon gate stack through said mask to form a polysilicon gate electrode by plasma etching in said etching chamber with an etchant gas containing a halogen species and whereby a chemisorbed halogen layer forms on said wafer;

(g) purging said etchant gas from said etching chamber with a neutral gas;

(h) after step (g) and without breaking vacuum, transferring said wafer from said etching chamber into said transfer chamber;

(i) subjecting said wafer to a second flow of a carrier gas containing water for a time period whereby said chemisorbed halogen layer is discharged from said surface regions and purged from said chamber;

(j) evacuating said transfer chamber;

(k) after step (j) and without breaking vacuum, transferring said wafer from said transfer chamber into said load lock; and (l) unloading said wafer from said etching tool.

9. The method of claim 8 wherein said mask comprises photoresist.

10. The method of claim 9 wherein said halogen species is HBr.

11. The method of claim 10 wherein said neutral gas is selected from the group consisting of helium, argon, and nitrogen.

12. The method of claim 8 wherein said water is introduced into said carrier gas by passing said carrier gas, first through a water bubbler, heated to between about 20 and 25° C. and thence into said transfer chamber at a flow rate sufficient to maintain a chamber pressure of between 2 and 4 Torr.

13. The method of claim 12 wherein said carrier gas is nitrogen.

14. The method of claim 8 wherein said time period is between about 30 and 60 seconds.

15. The method of claim 8 wherein said mask is photoresist.

16. A method for preventing the transport of halogens, chemisorbed on silicon wafers after plasma etching in an etching chamber into environments external to said etching chamber where they may react with moisture causing safety hazards, tool corrosion, and wafer yield degradation comprising:

(a) providing a silicon wafer;

(b) loading said wafer into an etching chamber of a plasma etching tool;

(c) evacuating said etching chamber;

(d) performing a plasma etching procedure within said etching chamber with a plasma containing a halogen species and whereby a chemisorbed halogen layer is formed on surface regions of said wafer;

(e) after step (d) and without breaking vacuum, subjecting said wafer to a gas flow containing water for a time period whereby said chemisorbed halogen layer is discharged from said surface regions;

(f) purging said second gas flow with a neutral gas; and (g) unloading said wafer.

17. The method of claim 16 wherein said etch chamber is interfaced by a load lock and said wafer is loaded into and unloaded out of said plasma etching tool through said load lock.

18. The method of claim 16 wherein said halogen species is HBr.

19. The method of claim 16 wherein said neutral gas is selected from the group consisting of helium, argon, and nitrogen.

20. The method of claim 16 wherein said water is introduced into said carrier gas by passing said carrier gas, first through a water bubbler, heated to between about 20 and 25° C. and thence into said transfer chamber at a flow rate sufficient to maintain a chamber pressure of between 2 and 4 Torr.

21. The method of claim 20 wherein said carrier gas is nitrogen.

22. The method of claim 16 wherein said time period is between about 30 and 60 seconds.

* * * * *